United States Patent [19]

Zhao

[11] Patent Number: 5,510,156
[45] Date of Patent: Apr. 23, 1996

[54] MICROMECHANICAL STRUCTURE WITH TEXTURED SURFACE AND METHOD FOR MAKING SAME

[75] Inventor: Yang Zhao, North Andover, Mass.

[73] Assignee: Analog Devices, Inc., Norwood, Mass.

[21] Appl. No.: 294,389

[22] Filed: Aug. 23, 1994

[51] Int. Cl.$^6$ .......................... C23C 14/02; B65D 6/08; B05D 1/36; B05D 1/32

[52] U.S. Cl. .................. 427/534; 216/12; 216/42; 216/67; 427/536; 427/539; 427/198; 427/203; 427/259; 427/264; 427/272; 427/307

[58] Field of Search ...................... 427/424, 425, 427/488, 534, 535, 536, 539, 198, 203, 259, 261, 262, 264, 270, 272, 274, 275, 307; 156/643, 656, 650, 644; 216/12, 42, 56, 67

[56] References Cited

U.S. PATENT DOCUMENTS

| | | | |
|---|---|---|---|
| 3,954,466 | 5/1976 | Beatty et al. | 427/76 |
| 3,992,212 | 11/1976 | Youtsey et al. | 427/220 |
| 4,272,564 | 6/1981 | Grewe et al. | 427/163 |
| 4,284,689 | 8/1981 | Craighead et al. | 428/620 |
| 4,407,695 | 10/1983 | Deckman et al. | 156/643 |
| 4,497,974 | 2/1985 | Deckman et al. | 136/259 |
| 4,705,659 | 11/1987 | Bernstein et al. | 156/664 |
| 4,711,128 | 12/1987 | Boura | 73/517 |
| 4,743,662 | 5/1988 | Lipowitz | 427/488 |
| 4,801,476 | 1/1989 | Dunsmuir et al. | 427/430.1 |
| 5,025,346 | 6/1991 | Tang et al. | 73/517 AV |
| 5,275,693 | 1/1994 | Nakuma | 216/42 |
| 5,314,574 | 5/1994 | Core et al. | 156/643 |
| 5,326,726 | 7/1994 | Tsang et al. | 437/228 |
| 5,364,493 | 11/1994 | Chau et al. | 156/643 |
| 5,411,630 | 5/1995 | Nagase et al. | 216/42 |

OTHER PUBLICATIONS

*Webster's 3rd New International Dictionary*, English, unabridged P. B. Gove, ed., Gec. Mernam Comp., Springfield, Mass. p. 664.

*Microfabrication of Molecular Scale Microstructures*, Deckman et al., 1987 American Institute of Physics, pp. 504–506 *Appl. Phys Lett.* 50(9) 2 Mar. 1987.

*Molecular Confinement in Nanometer–Size Superlattice Microstructures* Roxlo et al. 1986 The Amer. Phys. Society pp. 2462–2465 *Phys. Rev. Lett.*, vol. 57, #19 10 Nov. 1986.

Primary Examiner—Marianne Padgett
Attorney, Agent, or Firm—Wolf, Greenfield & Sacks

[57] ABSTRACT

A method for forming sub-micron sized bumps on the bottom surface of a suspended microstructure or the top surface of the underlying layer in order to reduce contact area and sticking between the two layers without the need for sub-micron standard photolithography capabilities and the thus-formed microstructure. The process involves the deposition of latex spheres on the sacrificial layer which will later temporarily support the microstructure, shrinking the spheres, depositing aluminum over the spheres, dissolving the spheres to leave openings in the metal layer, etching the sacrificial layer through the openings, removing the remaining metal and depositing the microstructure material over the now textured top surface of the sacrificial layer.

24 Claims, 3 Drawing Sheets

MICROMECHANICAL STRUCTURE WITH TEXTURED SURFACE AND METHOD FOR MAKING SAME

FIELD OF THE INVENTION

The invention pertains to suspended microstructures with textured surfaces to reduce sticking when they come in contact with other structures or surfaces and a method for fabricating such structures.

BACKGROUND OF THE INVENTION

Micromechanical structures for sensing a physical quantity such as acceleration, vibration or electrostatic potential are useful in many applications, including air bag deployment and active suspension in automobiles, and guidance systems in military weapons, among others.

One method of fabricating suspended microstructures is generally termed bulk-micromachining. In bulk-micromachining, a block of material, such as silicon, for example, is subtractively etched to remove material, leaving behind the desired microstructure shape suspended from the remainder of the substrate by very thin resilient connectors. Accordingly, in bulk-micromachining, the microstructure, the supporting portion of the substrate, and the thin connectors are monolithically constructed of the same material. U.S. Pat. No. 4,711,128 (Boura) discloses one such bulk-micromachined suspended microstructure.

Another method of fabricating chips with suspended micromachined microstructures is generally termed surface-micromachining. Surface-micromachining involves additive forming of the microstructure over a substrate. For instance, a sacrificial oxide spacer layer such as silicon dioxide is deposited over the surface of a substrate of a wafer. The sacrificial spacer layer is selectively etched to open up holes in the spacer layer, down to the substrate, in which anchors for supporting the microstructure will be formed. A thin film microstructure material, such as polysilicon, is deposited over the sacrificial layer. The microstructure material fills in the holes where the sacrificial layer had been etched down to the substrate and contacts the substrate to form anchors for supporting the microstructure. Enough microstructure material is deposited to fill in completely the holes as well as to form a uniform layer over the top of the sacrificial-layer. The microstructure material is then patterned into a desired shape by photolithography. Finally the sacrificial layer is removed (i.e., sacrificed) by, for instance, wet etching, thus leaving behind a microstructure suspended above the substrate by the anchors. International patent application publication No. WO93/25915, entitled MONOLITHIC CHIP CONTAINING INTEGRATED CIRCUITRY AND SUSPENDED MICROSTRUCTURE and assigned to the same assignee as the present application, discloses in detail one such method for manufacturing a surface-micromachined suspended microstructure.

FIG. 2 is a top plan view of an exemplary suspended microstructure. The microstructure comprises a bridge 112 suspended above a substrate 114 by four corner anchors 116. The bridge comprises a central beam 118 having a plurality of fingers 120 extending transversely therefrom. A suspended polysilicon stationary finger 122 is positioned parallel and adjacent to each finger 120 of the bridge 112. Stationary fingers 122 are also suspended o anchors and cantilevered over the substrate, but are substantially stationary because of their smaller mass and shorter length of extension beyond the anchor. FIG. 1 is a side view of the bridge 112 in which the stationary fingers 122 have been removed from the view in order not to obfuscate the illustration. FIG. 1 helps illustrate the anchors 116 and the elevation of the bridge 112 above the substrate 114. The polysilicon of the stationary fingers 122 and the bridge 112 is electrically conductive. The stationary fingers are connected via conductors embedded (i.e., formed) in the substrate to comprise two electrical nodes. In particular, the stationary fingers which are to the left of the corresponding moveable fingers form a first node which is charged to a first voltage and the stationary fingers which are to the right of the corresponding moveable fingers form a second node which is charged to a second voltage. The beam 112, including the moveable fingers, is a third node that is charged to a third voltage between the first and second voltages.

The first and second sets of stationary fingers and the moveable fingers form two capacitors. The two sets of stationary fingers form the first plate of first and second capacitors, respectively, and the moveable fingers form the second plate of both of the capacitors. When the chip is subjected to a force, the beam 112 moves relative to the stationary fingers 122, thus altering the capacitance between each stationary finger 122 and its corresponding moveable finger 120. Circuitry measures the change in aggregate capacitance, which is directly indicative of the acceleration to which the bridge is subjected. Preferably, the circuitry forms a closed loop including the beam, to provide a feedback signal which re-centers the beam when it is offset from its equilibrium position by acceleration. During both fabrication and normal use after fabrication, it is possible for the suspended moveable portion of a microstructure, such as beam 112, to be subject to a force which will cause a portion of the beam 112 (e.g., one of the moveable fingers) to come in contact with another portion of the chip. For instance, a moveable finger may contact a stationary finger, if subjected to a strong lateral force, or the bottom surface of the beam 112 may come in contact with the substrate, if subjected to a strong vertical force. Contact also may occur due to electrostatic attraction or, during fabrication, due to liquid surface tension during drying after a wet etch step. Such contact is undesirable since sticking between contacting surfaces, particularly when one or both of the surfaces is polysilicon, is likely. Once a portion of the suspended microstructure becomes stuck to another portion of the unit, it is very difficult to separate the two. Accordingly, sticking typically results in failure of the sensor.

International patent application publication No. WO93/25915 discloses a method for fabricating a surface-micromachined suspended microstructure in which bumps are formed on the bottom surface of the suspended microstructure. The bumps are formed by placing small hollows in the top surface of the spacer layer over which the microstructure material is deposited during fabrication by means of standard photolithography. When the microstructure material is deposited over the sacrificial layer, the microstructure material will fill in the hollows, forming bumps of microstructure material on the bottom surface of the microstructure. When the sacrificial layer is removed, the bumps remain on the bottom surface of the microstructure and serve to minimize the area of contact, between the microstructure and the substrate. If and when the bottom surface of the microstructure comes into contact with the substrate due to electrostatic forces, vertical acceleration, or liquid surface tension, only the bumps will contact, the surface. By thereby minimizing the area of contact the likelihood of sticking is reduced.

Also, by minimizing contact area, the magnitude of any electrostatic attraction is lessened, thus decreasing the likelihood of sticking even if contact occurs.

Generally, it is desirable to make the bumps as small as possible in order to minimize the contact area of the bumps and also to allow a large number of bumps to be placed throughout the bottom surface of the suspended microstructure without significantly affecting the mass or geometry of the structure. The minimum bump size which can be reliably achieved using standard photolithographic procedures, as discussed in international patent application publication WO93/25915, is limited by the process in use at the foundry where the chip is fabricated. Presently, a typical fabrication process line can achieve a minimum bump size of about 1 micron diameter.

Today, typical suspended microstructure geometries employ a minimum dimension of around a micron or larger. Accordingly, such chips are commonly fabricated in foundries with minimum size capabilities of 1 micron or larger. While there are foundries which can achieve higher resolution, e.g., minimum sizes of half a micron or possibly less, creating such a foundry is a significant expense and typically is not justifiable solely for the purpose of producing smaller bump sizes, if a less fine process is adequate in all other respects for the chip being produced.

SUMMARY OF THE INVENTION

The present invention provides for fine resolution texturing of surfaces of a microchip and particularly a microchip having a suspended microstructure in order to reduce sticking without the need to employ fine resolution photolithography.

In fabricating microstructures according to the present invention, a mono-layer of polymer spheres is electrostatically adhered to the surface to be textured, if it is an upwardly facing surface, or to an upwardly facing surface beneath the surface to be textured, if a downwardly facing surface. For example, if it is desired to texture the bottom surface of a surface-micromachined suspended microstructure, the spheres may be deposited over an underlying sacrificial layer prior to deposition of the microstructure layer. The polymer sphere mono-layer is deposited, for instance, by spraying the wafer (already bearing the sacrificial layer) with a liquid colloidal suspension of the polymer spheres in which the spheres are electrostatically charged or ionized. The spheres adhere to the wafer surface on a molecular level. The wafer is then rotated in a horizontal plane about an axis normal to the top surface of the sacrificial layer to order the spheres in a regular pattern. The speed of rotation should be fast enough to dislodge any spheres other than the first layer of spheres which are adhered directly to the wafer so as to form a mono-layer of contacting spheres on the surface. However, the speed should be slow enough not to create irregular voids between spheres in the mono-layer.

The spheres preferably are then shrunk by, for example, exposure to an oxygen (or other) plasma or by ion milling so as to create an ordered regular pattern of spheres on the top surface of the sacrificial layer, with regular spaces between them. A metal is then deposited over the wafer. The polymer spheres are then removed by an appropriate etchant which will etch through the spheres but not the metal. This leaves a metal pattern comprising metal depositions in the spaces between where the shrunken spheres had been, with the sacrificial layer exposed where the spheres had previously been. The sacrificial layer is then etched with the metal layer acting as an etch mask. This etching process will create hollows in the top surface of the sacrificial layer where the shrunken spheres previously had been. The hollows will have the diameter of the shrunk polymer spheres.

When the microstructure layer is deposited over the sacrificial layer, it will fill in the hollows, creating convex bumps of the bottom surface of the microstructure layer. The microstructure layer is then etched into the desired shape and the sacrificial layer is then removed by etching, thus leaving the suspended microstructure with convex bumps on its underside.

DETAILED DESCRIPTION OF THE INVENTION

Figure 1:
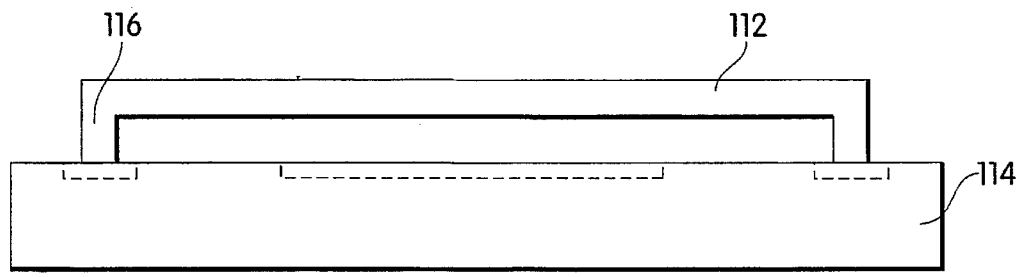
FIG. 1 is a side view of the bridge portion of an exemplary microstructure.

The present invention will be described with respect to FIGS. 3–9 which illustrate a chip during various stages of the fabrication process of a surface micromachined sensor structure in accordance with the present invention. The invention, however, can also be adapted to a bulk-micromachining process.

In at least one way of fabricating a surface micromachined microstructure, a sacrificial silicon oxide layer 12 is deposited on a silicon substrate 10. As will be discussed in greater detail herein, the silicon oxide layer 12 later will be selectively etched to create openings through layer 12 down to the top surface of substrate 10. The material from which the suspended sensor structure is to be formed, e.g., polysilicon, will then be deposited on the wafer to completely fill in the openings as well as form a blanket layer over the top surface of the sacrificial layer 12. The polysilicon will then be selectively etched into a desired shape. Finally, the sacrificial layer 12 will be etched in an etching process which will etch through and completely remove layer 12 without affecting the polysilicon microstructure. The portions of polysilicon which filled in the openings in sacrificial layer 12 down to the top surface of substrate 10 will be the anchors which support the structure on the substrate surface. The remainder of the polysilicon microstructure will be suspended from the anchors above the substrate, the space formerly occupied by the layer 12 now being emptied.

However, before any etching of layer 12 to form the anchor openings, a mono-layer of polymer particles, preferably spheres, is deposited on the top surface of sacrificial layer 12. There are numerous acceptable polymers from which to choose the sphere material. In the preferred embodiment, the material is a latex, and particularly, polystyrene. Polydevinylbenzine and polytoluene also are acceptable options. The size of the spheres will depend on the desired size of the variations (or bumps) in the surface to be textured. Polymer manufacturers can produce polymer spheres within extremely precise tolerances in both shape and size and in almost an infinite variety of sizes. Polystyrene spheres, for example, are widely available in sizes starting at sub-micron diameters. In the preferred embodiment, spheres are employed since they are readily available. However, particles of a wide variety of shapes could be used. In fact, cubes or other particles with flat surfaces would be preferable in terms of providing bumps likely to have minimal contact area. Of course, such shapes, are more complex to form than spheres and thus are not as readily available.

An ordered mono-layer coating of these spheres is deposited, in the preferred embodiment, by spraying the wafer with a liquid solution containing the spheres in colloidal suspension. The spheres preferably bear an electrostatic surface charge so that they repel each other slightly. The pH of the solution can be adjusted to alter the electrostatic forces between the spheres. In at least one preferred embodiment of the invention, the solution is a 10% by weight sulfate polystyrene latex in water with a surface charge density of 5.6 microcoulombs per square centimeter. Due to molecular adhesive forces, the spheres tend to adhere at the points where they contact the surface.

Because the electrostatic repulsive forces of the spheres are typically fairly weak, additional spheres will deposit over the first layer of spheres adhered to the wafer surfaces. Thus, to form a mono-layer, the wafer is then spun in a horizontal plane about an axis normal to the relevant surface to be coated, e.g., the top surface of the sacrificial layer. The spinning action causes the spheres which are not in the first layer and, thus, which are not molecularly adhered to the wafer, to be thrown off, leaving a mono-layer of spheres on the surface. The particles on the substrate also order themselves into a regular pattern due to inter-particle interactions. The speed of the spinning should be sufficiently fast to dislodge spheres overlying the first, adhered layer and to yield a densely packed ordered mono-layer of colloidal particles, but not so fast as to cause irregular voids to develop in the mono-layer coating. The goal is to form as nearly as possible a single layer of spheres on the surface of sacrificial layer 12 in a regular pattern. It has been found that, for a 4–6 inch wafer, a spinning rate of 1200 rpm is satisfactory.

Figure 3:
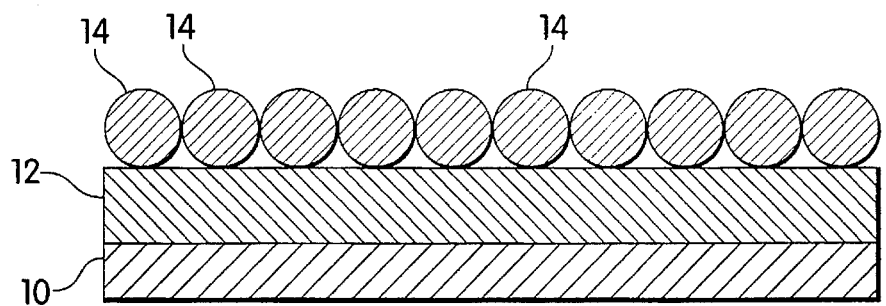
FIG. 3 is a cross-sectional side view of an exemplary wafer during a first stage of the fabrication method of the present invention.

FIG. 3 illustrates the wafer at this point in the fabrication process. FIG. 3 shows the spheres 14 in contacting relationship. However, the spheres may not necessarily be contacting each other depending on various factors, such as the spin speed, the extant electrostatic forces, and the properties of the colloidal solution.

In an exemplary embodiment of a sensor structure in accordance with the present invention, the texturing comprises convex bumps on the bottom surface of the microstructure that are approximately 0.2 to 0.3 microns in diameter and are spaced apart from each other approximately 1 micron center-to-center. However, the process described herein can be used to create bumps of essentially any desired size.

The size of the spheres deposited on the surface of the layer 12 is dictated primarily by the desired center-to-center spacing of the bumps. As will become clear from the discussion below, if the spheres are contacting each other at this point, the center to center spacing of the bumps formed by this process should be equal to the diameter of the spheres.

Once the mono-layer of tightly packed spheres 14 is adhered to the top surface of layer 12, the wafer is exposed to an oxygen plasma which will oxidize the spheres and shrink them at a controlled rate. The spheres should be shrunk to a size equal to the desired size of the bumps. In the illustrated embodiment of the invention, the bumps are 0.2–0.3 microns. Accordingly, the spheres are shrunk to an approximate size of 0.2–0.3 microns.

Figure 4:
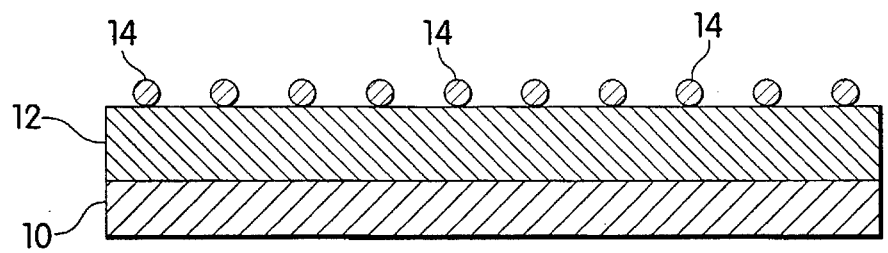
FIG. 4 is a cross-sectional side view of an exemplary wafer during a second stage of the fabrication method of the present invention.

FIG. 4 illustrates a cross-section of the wafer after the oxygen plasma step. As shown in FIG. 4, the exposure to oxygen plasma does not substantially affect the silicon dioxide layer 12 or the silicon substrate 10. Since the spheres have not moved but have only been shrunk, the center-to-center spacing of the spheres is still approximately 1 micron, as it was before shrinkage. The spheres now, however, are no longer contacting each other since they have diameters of only approximately 0.2–0.3 microns.

The spheres alternatively may be shrunk by ion milling which also will not substantially affect the sacrificial layer 12 or the silicon substrate 10 if the energy is kept within reasonable bounds.

Figure 5:
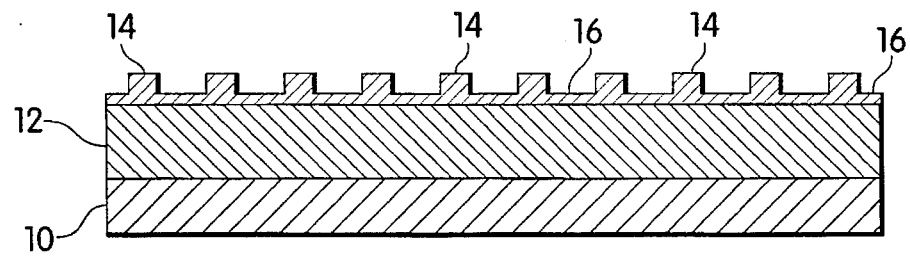
FIG. 5 is a cross-sectional side view of an exemplary wafer during a third stage of the fabrication method of the present invention.

The next step is to sputter coat a metal layer (aluminum, in the illustrated embodiment) on the top surface of the wafer in order to cover the top surface of layer 12 and the spheres 14. FIG. 5 illustrates a cross-section of the wafer after this step. The aluminum layer is illustrated at 16.

Figure 6:
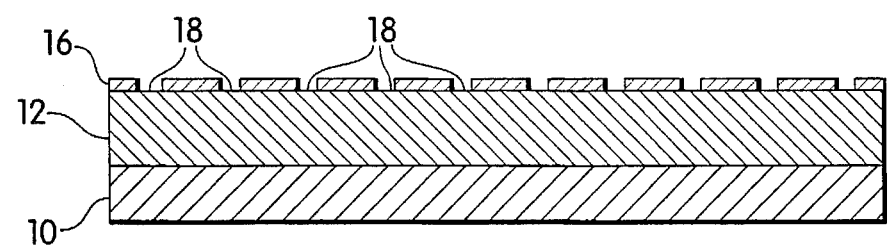
FIG. 6 is a cross-sectional side view of an exemplary wafer during a fourth stage of the fabrication method of the present invention.

Next, the spheres are dissolved, for example, by immersing the wafer in an appropriate corrosive chemical bath; a toluene bath works well with polystyrene spheres. The toluene bath will dissolve the polystyrene spheres without affecting the aluminum 16, the sacrificial layer 12, or the substrate 10. Although the toluene bath will not affect the aluminum, per se, the portions of aluminum, which overcoat the spheres 14 will be released since they are bonded to the spheres and to nothing else. Accordingly, after the toluene bath, the spheres will be dissolved leaving in their places gaps 18 in the aluminum coating 16 over sacrificial layer 12, as illustrated in FIG. 6.

Figure 7:
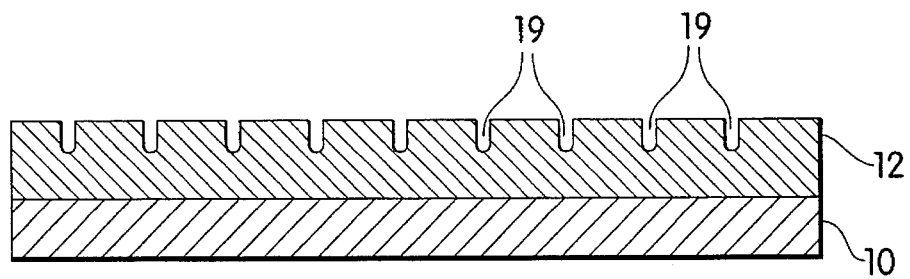
FIG. 7 is a cross-sectional side view of an exemplary wafer during a fifth stage of the fabrication method of the present invention.

The patterned aluminum layer is now used as a mask for plasma etching the sacrificial layer 12. The plasma etching process will etch through the exposed portions of the silicon dioxide sacrificial layer 12 much faster than through the aluminum layer 16. The duration of the plasma etching process is selected so as to etch a distance into the exposed regions of the sacrificial layer 12 equal to the desired depth of the bumps on the bottom surface of the microsensor structure. The thickness of the aluminum layer which was previously deposited is selected to be thick enough as to not be etched completely through its thickness during the plasma The aluminum layer is then removed by using standard aluminum wet or dry etching process. The etch process should be selected so as to etch through the aluminum without affecting the sacrificial layer or the substrate. Anchor openings which extend completely through the sacrificial layer down to the substrate are also etched through the sacrificial layer. This is done in a separate process with a separate mask and may be done at this point or any appropriate time earlier in the fabrication process. FIG. 7 is a side cross-section of the wafer at this point in the fabrication process. As shown, the sacrificial layer 12 now has hollows 19 formed in its top surface.

Figure 8:
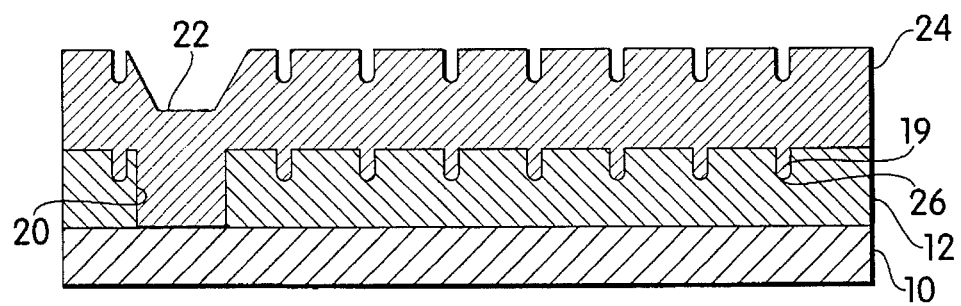
FIG. 8 is a cross-sectional side view of an exemplary wafer during a sixth stage of the fabrication method of the present invention.

At this point, the material of the microstructure, e.g., polysilicon, is deposited over the sacrificial layer filling in the anchor opening and the hollows 19 in the top surface of the sacrificial layer 12. Enough polysilicon is deposited to fill in completely the anchor openings and the hollows, and to form a blanket above the top surface of the sacrificial layer of a thickness equal to the desired thickness of the microstructure, e.g., 2 micron. The polysilicon may be deposited by a low pressure chemical vapor deposition (LPCVD) process or any other acceptable process. FIG. 8 illustrates the cross-section of the wafer at this point in the fabrication process. FIG. 8 shows an anchor opening 20 which is filled by anchor 22, the main layer 24 of the polysilicon structure and bumps 26 on the bottom surface of the main layer of the polysilicon structure.

Figure 2:
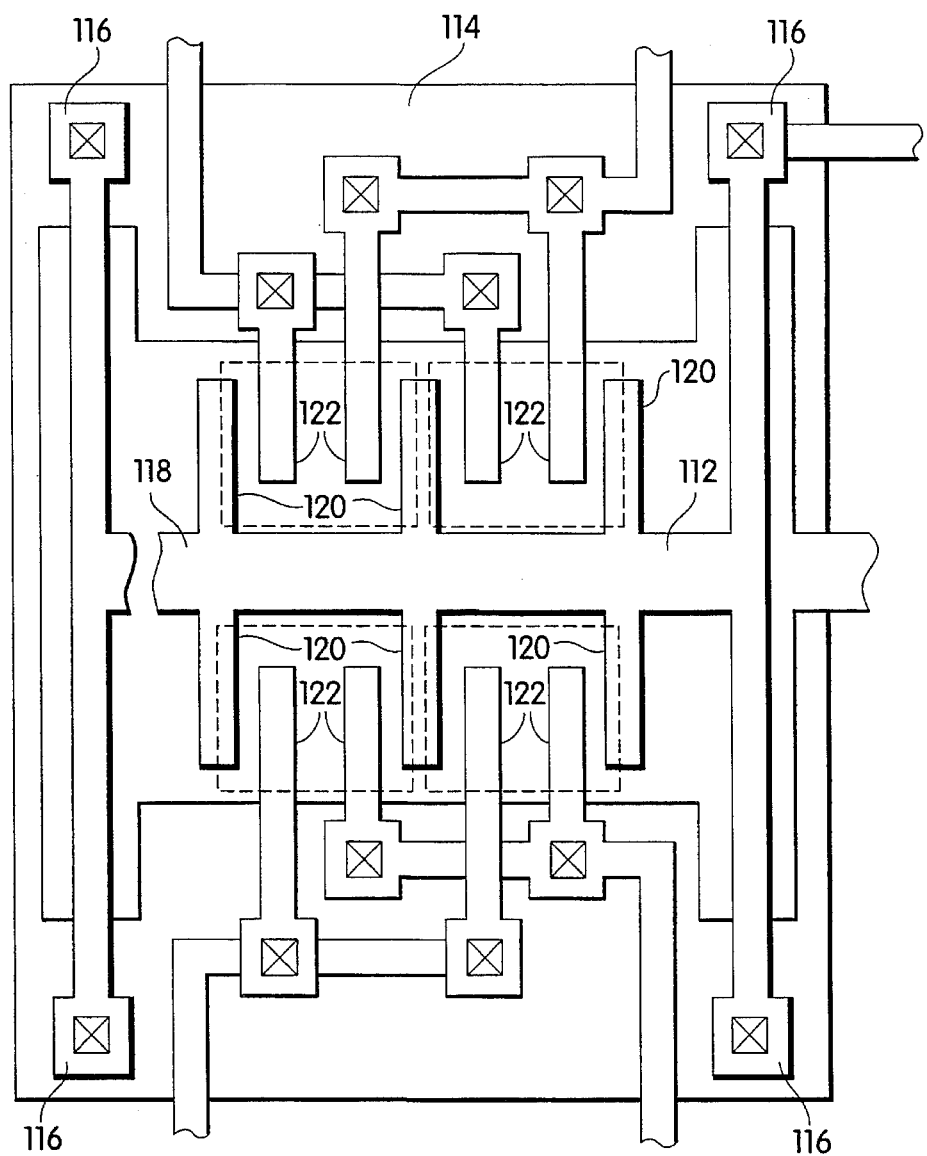
FIG. 2 is a top plan view of the microstructure of FIG. 1.

At this point, the polysilicon structure is still supported by the sacrificial layer 12. The polysilicon layer is now etched into the desired final microstructure shape, such as illustrated in FIG. 2. This etching can be done by a dry etch process or any other acceptable process.

Figure 9:
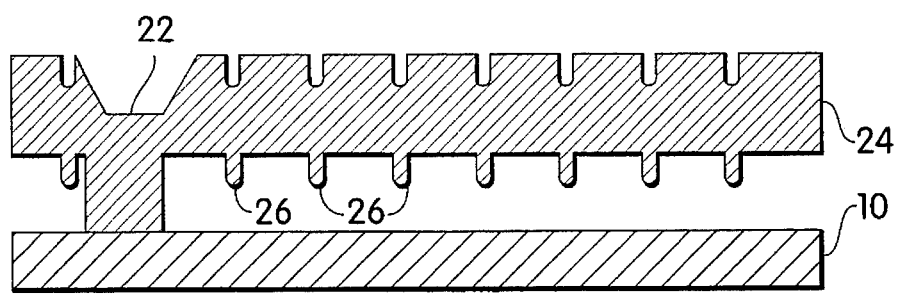
FIG. 9 is a cross-sectional side view of an exemplary wafer during a seventh stage of the fabrication method of the present invention.

Once the microstructure is fully shaped, the sacrificial layer is etched completely away, leaving the microstructure suspended over the substrate 10 by anchors 22. FIG. 9 illustrates a cross-section of the wafer after this final microstructure release step. As shown in that figure, the bottom surface of the main layer 24 of the microstructure includes regularly spaced bumps 26 which will minimize contact area with the substrate should the microstructure be bent down by mechanical, electrostatic or any other force to contact the substrate.

It should be understood by those skilled in the art that, while the above discussion describes a preferred set of steps for creating a textured surface in accordance with the present invention, the actual process for fabricating a suspended microstructure on a wafer has been simplified in this discussion so as not to obfuscate the invention. In practice, many additional steps will probably be needed which are not expressly discussed herein but which are clearly understood by those skilled in the art. Additional steps will particularly be needed if circuitry also is to be monolithically incorporated on the wafer.

The present invention is intended to be incorporated generally into the overall monolithic accelerometer fabrication process described in international patent application publication No. WO93/25915. Accordingly, it should be understood that a significant number of steps which are not discussed herein occur prior to the deposition of the spheres. The most notable of those steps, of course, would be the deposition of the sacrificial layer 12 on the substrate 10. Further, steps relating to other aspects of the fabrication of a chip containing a suspended microstructure may be dispersed intermediate the steps described in this disclosure. In particular, it is likely that many steps which are not discussed in this disclosure occur between the etching of the polysilicon into the desired shape and the final beam release by removal of the sacrificial layer, i.e., between the stages illustrated by FIGS. 8 and 9.

For instance, it is envisioned that the steps of deposition of the spheres onto the top surface of sacrificial layer 12 up to the plasma etching of the bumps would replace process 43 in the procedure disclosed in international patent application publication No. WO93/25915. Further, the process of constructing the microsensor would be performed generally in accordance with processes 44–49 described in international patent application publication No. WO93/25915 and that steps generally in accordance with processes 50–66 discussed in international patent application publication No. WO93/25915 will be performed after the deposition of the polysilicon layer, but before the final release of the beam. The disclosure of international patent application publication No. WO93/25915 is incorporated herein by reference.

Figure 10:
FIG. 10 is a cross-sectional side view of an exemplary wafer during a stage of an alternate embodiment of the fabrication method of the present invention.

As an alternative to the above-described preferred process, upwardly facing bumps 51 can be formed on the top surface of silicon layer 10 rather than, or in addition to, forming bumps on the bottom surface of the polysilicon main layer 24. This would be accomplished by depositing the spheres on the silicon layer prior to deposition of the sacrificial layer 12. The spheres are shrunk as previously described. At this point, a dry etching process should be selected which etches through both the spheres and the silicon layer, which etching is stopped when the spheres are completely dissolved. This will leave a silicon surface having upwardly extending bumps, as illustrated in FIG. 10. The sacrificial oxide layer can then be deposited and the fabrication procedure continued as generally described in international patent application publication No. WO93/25915.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A method of fabricating a suspended microstructure comprising the steps of:

(1) depositing a sacrificial layer on a substrate, said layer having a top surface, (2) depositing a mono-layer of particles of a first size on said surface of said sacrificial layer, (3) shrinking said particles to a second size smaller than said first size, (4) depositing a layer of mask material over said sacrificial layer and said particles, (5) removing said particles such that portions of said mask material overlying said particles are removed while portions not overlying said particles remain on said surface, (6) etching said sacrificial layer using said mask material as an etch mask so as to form hollows in said surface of said sacrificial layer, (7) removing said mask material, (8) removing portions of said sacrificial layer to form holes in said sacrificial layer for formation of anchors for said microstructure;

(9) depositing a microstructure material over said substrate and said sacrificial layer to form said microstructure, said microstructure material filling the holes in said sacrificial layer to form said anchors, and

(10) removing said sacrificial layer, a surface of said microstructure material that was in contact with the top surface of said sacrificial layer before removal of said sacrificial layer having bumps corresponding to said hollows, wherein a dimension of said bumps is defined by the second size of said particles and a spacing between said bumps is defined by the first size of said particles.

2. A method as set forth in claim 1 further comprising the step of removing portions of said microstructure material to form said microstructure material into a predetermined shape.

3. A method as set forth in claim 1 wherein said particles are latex.

4. A method as set forth in claim 1 wherein said particles are polystyrene.

5. A method as set forth in claim 3 wherein step (2) comprises the steps of:

(2.1) providing a solution in which said particles are in suspension, and (2.2) spraying said substrate bearing said sacrificial layer with said solution.

6. A method as set forth in claim 4 wherein step (2) further comprises the step of (2.3) spinning said substrate about an axis perpendicular to said top surface of said sacrificial layer.

7. A method as set forth in claim 6 wherein step (3) comprises exposing said particles to an oxygen plasma.

8. A method as set forth in claim 1 wherein said mask material is a metal.

9. A method as set forth in claim 8 wherein said mask material is aluminum.

10. A method as set forth in claim 1 wherein said first size of said particles is about 1 micron in diameter.

11. A method as set forth in claim 10 wherein said second size of said particles is about 0.2–0.3 microns in diameter.

12. A method as set forth in claim 1 wherein step (5) comprises immersing said substrate bearing said particles in a bath that is corrosive to said particles.

13. A method as set forth in claim 12 wherein said bath is a toluene bath.

14. A method as set forth in claim 1 wherein the step of etching said sacrificial layer comprises plasma etching.

15. A method for texturing a surface of a substrate comprising the steps of:

depositing a mono-layer of particles of a first size on said surface, shrinking said particles to a second size smaller than said first size, etching a portion of said surface between said particles, and removing said particles, said surface of said substrate thereby being textured with bumps at locations corresponding to previous locations of said particles, wherein a dimension of said bumps is defined by the second size of said particle and a spacing between said bumps is defined by the first size of said particles.

16. A method as set forth in claim 15 wherein said steps of etching said surface and removing said particles are performed simultaneously.

17. A method as set forth in claim 16 wherein said steps of etching said surface and removing said particles comprise dry etching said surface and said particles simultaneously.

18. A method of fabricating a suspended microstructure comprising the steps of:

depositing a sacrificial layer on a substrate, said layer having a top surface, spraying said substrate bearing said sacrificial layer with a solution in which polystyrene spheres of a first size are in suspension, spinning said substrate about an axis perpendicular to said top surface of said sacrificial layer while in said solution, removing portions of said sacrificial layer so as to create holes in said sacrificial layer for formation of anchors for said microstructure, exposing said spheres to oxygen plasma so as to shrink said spheres to a second size smaller than said first size, depositing a layer of aluminum over said sacrificial layer and said spheres, immersing said substrate bearing said spheres in a bath that is corrosive to said spheres so as to remove said spheres and a portion of said mask material overlying said spheres, plasma etching said sacrificial layer using said aluminum as an etch mask so as to form hollows in said top surface of said sacrificial layer, removing said aluminum by etching, depositing a microstructure material over said substrate and said sacrificial layer to form said microstructure, said microstructure material filling the holes in said sacrificial layer to form said anchors, and removing said sacrificial layer, a surface of said microstructure material that was in contact with the top surface of said sacrificial layer before removal of said sacrificial layer having bumps corresponding to said hollows, wherein a dimension of said bumps is defined by the second size of said spheres and a spacing between said bumps is defined by the first is of said spheres.

19. A method for fabricating a suspended microstructure comprising the steps of:

(1) depositing a mono-layer of particles of a first size on a surface of a substrate, (2) shrinking said particles to a second size smaller than said first size, (3) simultaneously etching through said particles and said substrate until said particles are completely removed, said surface of said substrate thereby being textured with bumps at locations corresponding to previous locations of said particles, wherein a dimension of said bumps is defined by the second size of said particles and a spacing between said bumps is defined by the first size of said particles, (4) depositing a sacrificial layer on said substrate, (5) removing portions of said sacrificial layer to form holes in said sacrificial layer for formation of anchors for said microstructure, (6) depositing a microstructure material over said substrate and said sacrificial layer, to form said microstructure, said microstructure material filling the holes in said sacrificial layer to form said anchors, and (7) removing said sacrificial layer.

20. A method as set forth in claim 19 wherein said particles are latex.

21. A method as set forth in claim 20 wherein said particles are spheres.

22. A method as set forth in claim 19 wherein said particles are polystyrene.

23. A method as set forth in claim 19 wherein step (1) comprises the steps of:

(1.1) providing a solution in which said particles are in suspension, and (1.2) spraying said substrate bearing said sacrificial layer with said solution.

24. A method as set forth in claim 19 wherein step (1) further comprises the step off (1.3) spinning said substrate about an axis perpendicular to said top surface of said sacrificial layer.

* * * * *